(12) United States Patent
Hsu

(10) Patent No.: US 10,026,690 B1
(45) Date of Patent: Jul. 17, 2018

(54) FUSE BLOWING METHOD AND FUSE BLOWING SYSTEM

(71) Applicant: NANYA TECHNOLOGY CORPORATION, New Taipei (TW)

(72) Inventor: Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/653,517

(22) Filed: Jul. 18, 2017

(51) Int. Cl.
*G11C 17/18* (2006.01)
*H01L 23/525* (2006.01)
*H01L 21/82* (2006.01)
*H01L 27/10* (2006.01)

(52) U.S. Cl.
CPC .......... *H01L 23/5256* (2013.01); *H01L 21/82* (2013.01); *H01L 27/10* (2013.01); *H01L 2924/0002* (2013.01)

(58) Field of Classification Search
CPC ..... H01L 23/5256; H01L 21/82; H01L 27/10; H01L 2924/0002
USPC .......................................... 365/201
See application file for complete search history.

(56) References Cited

U.S. PATENT DOCUMENTS

| | | | |
|---|---|---|---|
| 6,278,651 B1 * | 8/2001 | Weinfurtner ........... | G11C 5/145 365/225.7 |
| 7,817,455 B2 * | 10/2010 | Fredeman .............. | G11C 17/16 365/189.09 |
| 2009/0289697 A1 | 11/2009 | Gabillard et al. | |

\* cited by examiner

*Primary Examiner* — Pho M Luu
*Assistant Examiner* — Xiaochun L Chen
(74) *Attorney, Agent, or Firm* — CKC & Partners Co., Ltd.

(57) ABSTRACT

A fuse blowing method is disclosed. The fuse blowing method includes the following operations: receiving a number signal, in which the number signal includes a number; triggering the number of several fuse pumps according to the number signal; and generating a current to blow a fuse.

10 Claims, 2 Drawing Sheets

FUSE BLOWING METHOD AND FUSE BLOWING SYSTEM

FIELD OF INVENTION

The invention relates to a fuse blowing method and a fuse blowing system. More particularly, the invention relates to a fuse blowing method and a fuse blowing system for speeding up a fuse blowing time.

BACKGROUND

An integrated circuit may include redundant components that can be used to substitute damaged componentry. For example, one type of memory circuit includes a dynamic random access memory (DRAM) array of memory cells. The memory cells are arranged in rows and columns, each of which is addressable for purposes of storing a bit of information. As the density of memory cells increase, the number of faulty cells also increases during the fabrication process. To reduce the effect of faulty cells, redundant memory cells, or rather redundant sections of memory cells may be used to repair a damaged section of the array, wherein the damaged section includes one or more damaged memory cells.

Once a damaged section of the integrated circuit is identified, the repair process includes replacing the damaged section with a redundant resource. For instance, in the memory array, selection of the redundant section may be achieved through the application of fuse circuitry. More specifically, a fuse that is associated with a redundant section may be blown, such that when the fuse is intact, the original but later damaged section of memory is accessed for memory storage, but when the fuse is blown, the redundant section is then used for memory storage instead of the damaged section. Various techniques may be used to blow the fuse. However, blowing the fuse may be time consuming.

Therefore, how to speed up the fuse blowing time are problems to be improved in the field.

SUMMARY

An embodiment of this disclosure is to provide a fuse blowing method. The fuse blowing method includes the following operations: receiving a number signal, in which the number signal includes a number; triggering the number of several fuse pumps according to the number signal; and generating a current to blow a fuse.

An embodiment of this disclosure is to provide a fuse blowing system. The fuse blowing system includes a controller and several fuse pumps. The controller is configured to receive a number signal, in which a number signal comprises a number. The number of the fuse pumps is triggered according to the number signal to generate a current to blow a fuse.

The embodiment of the present disclosure is to provide a fuse blowing method and a fuse blowing system, in order to speed up the fuse flowing time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
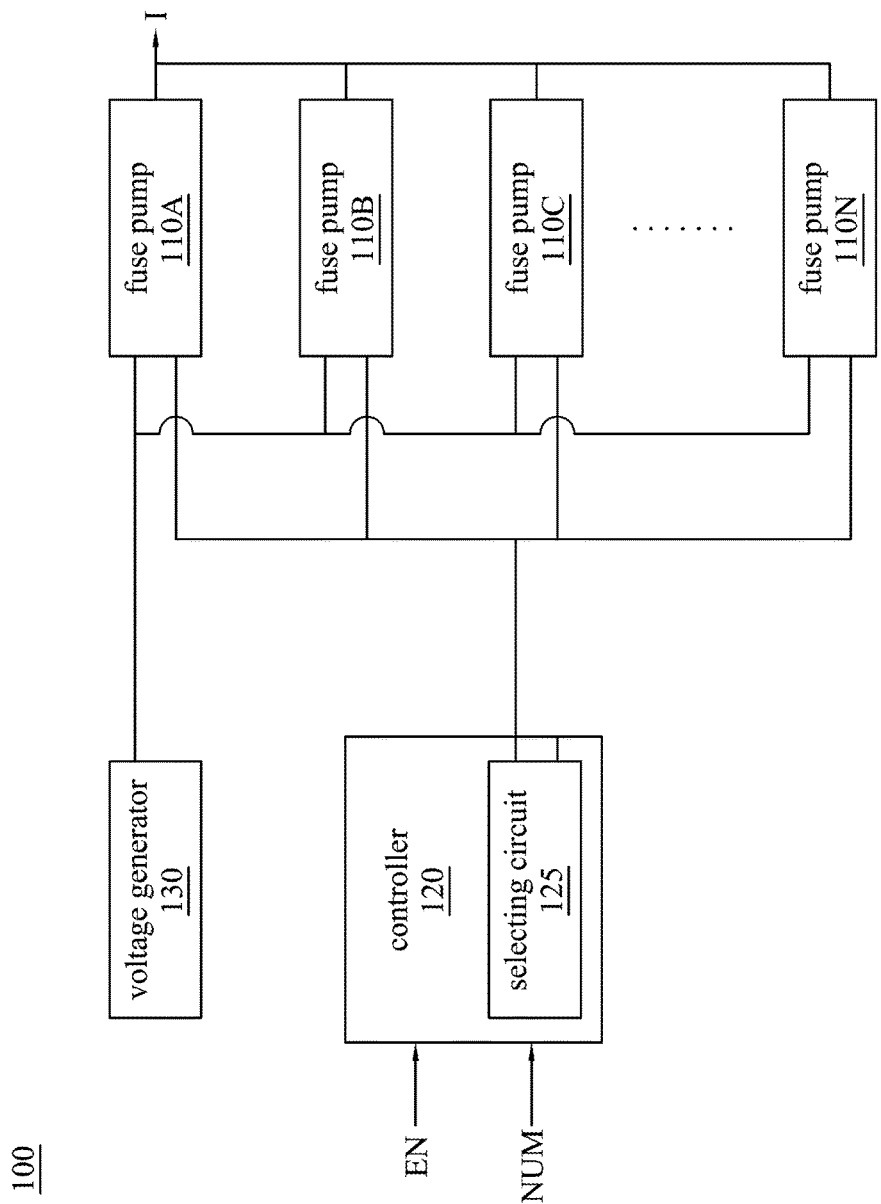
FIG. 1 is a schematic diagram illustrating a fuse blowing system according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram illustrating a fuse blowing system 100 according to some embodiments of the present disclosure. As illustrated in FIG. 1, the fuse blowing system 100 includes several fuse pumps 110A~110N and a controller 120. The fuse blowing system 100 shown in FIG. 1 is for illustrative purposes only and the present disclosure is not limited thereto.

In some embodiments, the controller 120 is configured to receive a number signal NUM. The number signal NUM includes a number. In some embodiments, the number signal NUM may be generated automatically. In some embodiments, the number signal NUM may be determined by a user. According to the number signal NUM, a number of the fuse pumps 110A~110N may be triggered. For example, if the number signal NUM includes a number of two, two of the fuse pumps 110A~110N may be triggered. If the number signal NUM includes a number of four, four of the fuse pumps 110A~110N may be triggered. If the number signal NUM includes a number of eight, eight of the fuse pumps 110A~110N may be triggered. The fuse pumps 110A~110N that are triggered may generate a current I. In some embodiments, the current I may be sent to a DRAM array (not shown) to blow a fuse.

In some embodiments, after the controller 120 receives the number signal NUM, the controller 120 generates a triggering signal to the fuse pumps 110A~110N to trigger a number of the fuse pumps 110A~110N.

In some embodiments, the controller 120 is configured to receive an enable signal EN and a number signal NUM. The controller 120 is configured to generate a triggering signal according to the enable signal and the number signal. For example, in some embodiments, the controller 120 may only generates a triggering signal to the fuse pumps 110A~110N only when the enable signal EN is received, and after receiving the enable signal EN, the controller 120 triggers a number of fuse pumps 110A~110N according to the number signal NUM.

In some embodiments, the fuse blowing system 100 includes a voltage generator 130. The voltage generator 130 is configured to generate a working voltage and send the working voltage to the fuse pumps 110A~110N. The working voltage is provided to the fuse pumps 110A~110N for the fuse pumps 110A~110N to generate the current I.

In some embodiments, the controller 120 further includes a selecting circuit 125. The selecting circuit 125 is configured to select the number of the fuse pump 110A~110N according to the number signal NUM.

Figure 2:
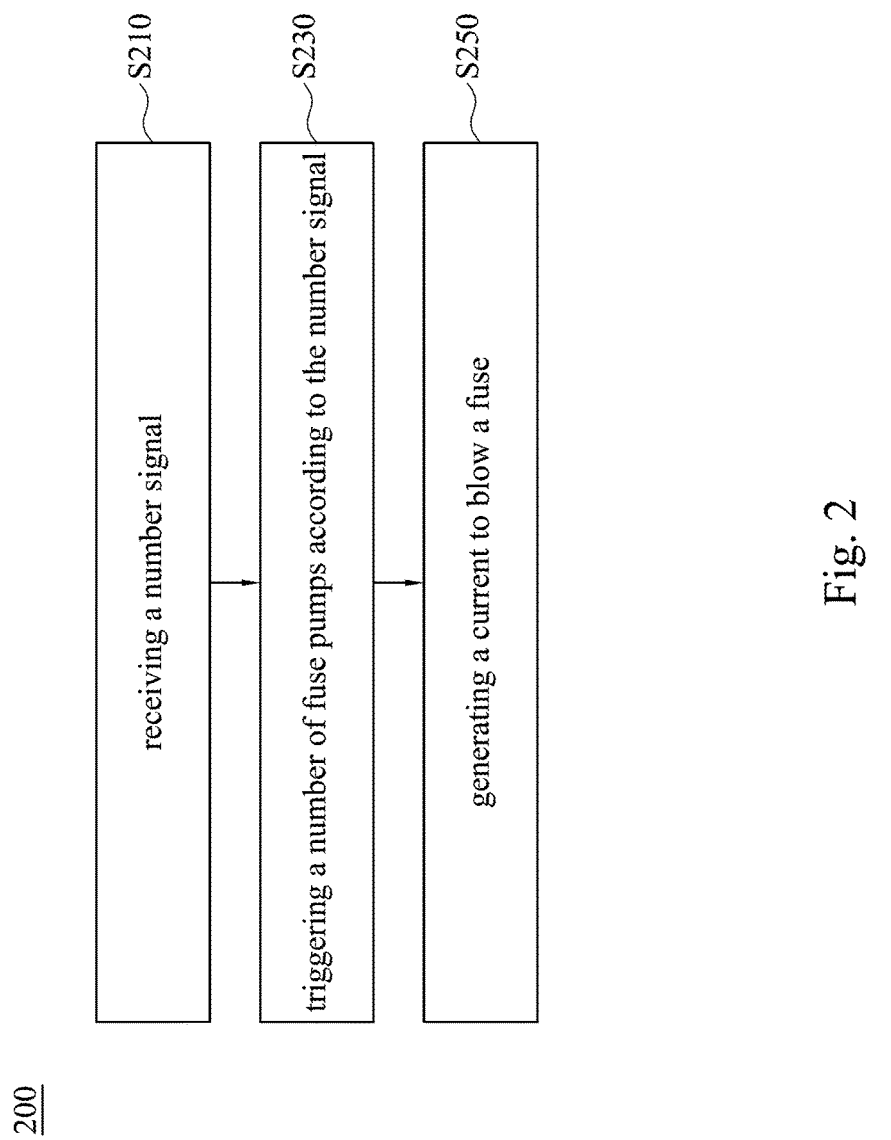
FIG. 2 is a flow chart illustrating a fuse blowing method according to some embodiments of the present disclosure.

Reference is made to FIG. 2. FIG. 2 is a flow chart illustrating a fuse blowing method 200 according to some embodiments of the present disclosure. The fuse blowing method 200 includes the following operations:

S210: receiving a number signal;
S230: triggering a number of fuse pumps according to the number signal; and
S250: generating a current to blow a fuse.

For convenience of explanation and understanding, reference is made to both FIG. 1 and FIG. 2.

In operation S210, receiving a number signal. In some embodiments, operation S210 may be performed by the controller 120. For example, the controller 120 in FIG. 1 may receive a number signal NUM. The number signal NUM includes a number.

In operation S230, triggering a number of fuse pumps according to the number signal. In some embodiments, operation S230 may be performed by the controller 120. For example, the controller 120 may trigger a number of fuse pumps 110A~110N according to the number signal NUM. For example, if the number signal NUM includes a number of two, two of the fuse pumps 110A~110N may be triggered.

In some embodiments, after receiving a number signal NUM, a triggering signal is sent to the number of fuse pumps 110A~110N according to the number signal NUM to trigger the number of fuse pumps 110A~110N.

In some embodiments, operation S210 includes receiving an enable signal EN. In operation S230, a triggering signal is sent to the number of fuse pumps 110A~110N according to the number signal NUM and the enable signal EN to trigger the number of fuse pumps 110A~110N. For example, in some embodiments, the triggering signal may be sent to the fuse pumps 110A~110N only when the enable signal EN is received, and after receiving the enable signal EN, a number of fuse pumps 110A~110N are triggered according to the number signal NUM.

In some embodiments, operation S230 includes selecting a number of fuse pumps 110A~110N to trigger. In some embodiments, operation S230 may be performed by the selecting circuit 125.

In operation S250, generating a current to blow a fuse. In some embodiments, operation S250 may be performed by the fuse pumps 110A~110N. For example, in some embodiments, if two of the fuse pumps 110A~110N are triggered, two of the fuse pumps 110A~110N may generate a current I to blow a fuse (not shown). If four of the fuse pumps 110A~110N are triggered, four of the fuse pumps 110A~110N may generate a current I to blow a fuse.

In some embodiments, operation S250 includes generating a working voltage and sending the working voltage to the fuse pumps. In some embodiments, working voltage may be generated and sent by the voltage generator 130. For example, the voltage generator 130 may generate a working voltage and send the working voltage to the fuse pumps 110A~110N.

According to the embodiment of the present disclosure, it is understood that the embodiment of the present disclosure is to provide a fuse blowing method and a fuse blowing system, in order to speed up the fuse flowing time. Furthermore, the fuse blowing time may be controlled by the user by setting the number signal.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fuse blowing method, comprising:
receiving a number signal, wherein the number signal comprises a number;
triggering the number of a plurality of fuse pumps according to the number signal; and
generating a current to blow a fuse.

2. The fuse blowing method of claim 1, comprising:
sending a triggering signal according to the number signal to the fuse pumps to trigger the number of the fuse pumps.

3. The fuse blowing method of claim 1, comprising:
generating a working voltage; and
sending the working voltage to the fuse pumps.

4. The fuse blowing method of claim 1, comprising:
receiving an enable signal; and
sending a triggering signal according to the number signal and the enable signal to the number of the fuse pumps to trigger the number of the fuse pumps.

5. The fuse blowing method of claim 1, comprising:
selecting the number of the fuse pumps to trigger.

6. A fuse blowing system, comprising:
a controller configured to receive a number signal, wherein a number signal comprises a number; and
a plurality of fuse pumps, wherein the number of the fuse pumps is triggered according to the number signal to generate a current to blow a fuse.

7. The fuse blowing system of claim 6, wherein the controller is configured to receive an enable signal, and the controller is configured to generate a triggering signal according to the enable signal and the number signal.

8. The fuse blowing system of claim 6, comprising:
 a voltage generator configured to generate a working voltage and send the working voltage to the fuse pumps.

9. The fuse blowing system of claim 6, wherein the controller is configured to generate a triggering signal according to the number signal.

10. The fuse blowing system of claim 6, further comprising:
 a selecting circuit configured to select the number of the fuse pumps to trigger.

\* \* \* \* \*